(12) United States Patent  (10) Patent No.: US 9,310,814 B2
Hatta  (45) Date of Patent: Apr. 12, 2016

(54) COOLING DEVICE OPERATING METHOD AND INSPECTION APPARATUS

(75) Inventor: Masataka Hatta, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 203 days.

(21) Appl. No.: 13/423,971

(22) Filed: Mar. 19, 2012

(65) Prior Publication Data

US 2012/0234528 A1  Sep. 20, 2012

(30) Foreign Application Priority Data

Mar. 19, 2011  (JP) .................................. 2011-61823

(51) Int. Cl.
*G05D 23/00* (2006.01)
*G05D 23/19* (2006.01)
*H01L 21/67* (2006.01)

(52) U.S. Cl.
CPC ....... *G05D 23/1919* (2013.01); *H01L 21/67109* (2013.01); *H01L 21/67248* (2013.01)

(58) Field of Classification Search
CPC ....... F25D 25/00; F25D 19/00; F25D 19/006; F25B 31/006; C23C 16/4589; C23C 16/46; C23C 14/541; G05D 23/1919; H01L 21/67248; H01L 21/67109
USPC .......... 62/62, 126, 259.2, 434; 118/724–726; 165/61, 87, 48.1, 287
See application file for complete search history.

(56) References Cited

U.S. PATENT DOCUMENTS

| 5,058,389 A * | 10/1991 | Yasuda et al. ...................... 62/99 |
| 5,084,671 A * | 1/1992 | Miyata et al. ............ 324/750.09 |
| 5,198,752 A * | 3/1993 | Miyata et al. ............ 324/750.08 |
| 5,584,971 A * | 12/1996 | Komino .................... 204/192.13 |
| 6,032,724 A * | 3/2000 | Hatta .......................... 165/80.2 |
| 2004/0036861 A1* | 2/2004 | Yoshioka .................... 356/237.1 |
| 2004/0100297 A1* | 5/2004 | Tanioka et al. ............... 324/765 |
| 2005/0253611 A1* | 11/2005 | Yoshioka ....................... 324/754 |
| 2007/0023320 A1* | 2/2007 | Itakura et al. ................. 206/710 |
| 2007/0204610 A1* | 9/2007 | Hatta ............................. 60/520 |
| 2008/0257537 A1* | 10/2008 | Hatta et al. ..................... 165/263 |
| 2009/0096475 A1* | 4/2009 | Yamamoto et al. ........... 324/760 |
| 2009/0289050 A1* | 11/2009 | Ondricek ...................... 219/386 |

FOREIGN PATENT DOCUMENTS

| CN | 101149627 A | 3/2008 |
| JP | 2006-308273 A | 11/2006 |
| JP | 2007-218500 A | 8/2007 |
| JP | 2007-240035 A | 9/2007 |
| JP | 2008311483 A | 12/2008 |
| JP | 2009145151 A | 7/2009 |

\* cited by examiner

*Primary Examiner* — Ljiljana Ciric
*Assistant Examiner* — Kirstin Oswald
(74) *Attorney, Agent, or Firm* — Nath, Goldberg & Meyer; Jerald L. Meyer

(57) ABSTRACT

A cooling device operating method and corresponding cooling device used in an inspection apparatus. The method controls a cooling device which in turn cools a wafer chuck on which a semiconductor wafer is loaded. The temperature of the wafer chuck is controllable using the cooling device and a heating device. Low temperature and high temperature inspections of the wafer are performed under control of the controller. The cooling device is continuously run via the controller for the low temperature inspection, but it is stopped at least one time at the start of the high temperature inspection via the controller.

4 Claims, 5 Drawing Sheets

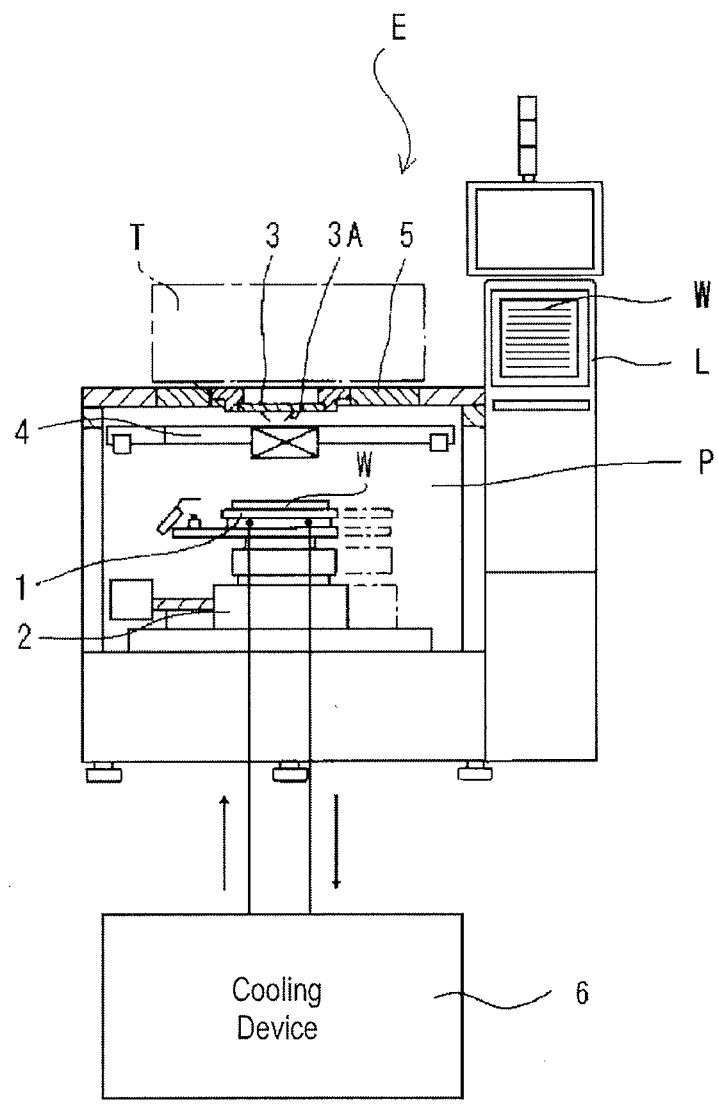

COOLING DEVICE OPERATING METHOD AND INSPECTION APPARATUS

CROSS-REFERENCE TO RELATED APPLICATION

This application claims the benefit of Japanese Patent Application No. 2011-61823, filed on Mar. 19, 2011, in the Japan Patent Office, the disclosure of which is incorporated herein in its entirety by reference.

TECHNICAL FIELD

The present disclosure relates to an inspection apparatus for high and low temperature inspections, and a method for operation of a cooling device used in the inspection apparatus.

BACKGROUND

For example, as shown in FIG. 4, an existing inspection apparatus includes a loader chamber L which carries a semiconductor wafer W, a probe chamber P which inspects electrical characteristics of the semiconductor wafer W carried from the loader chamber L, and a controller (not shown). Under control of the controller, this apparatus is configured to carry the semiconductor wafer W from the loader chamber L to the probe chamber P, inspect the electrical characteristics of the semiconductor wafer W in the probe chamber P, and then return the semiconductor wafer W to its original condition.

As shown in FIG. 4, the probe chamber P includes a temperature controllable wafer chuck 1 which loads the semiconductor wafer W, an XY table 2 which moves the wafer chuck 1 in X and Y directions, a probe card 3 which is arranged above the wafer chuck 1 moving over the XY table 2, and an alignment mechanism 4 which makes a precise alignment of a plurality of probes 3A of the probe card 3 with a plurality of pads of the semiconductor wafer W on the wafer chuck 1.

In addition, as shown in FIG. 4, a test head T of a tester is pivotally arranged on a head plate 5 of the probe chamber P and is electrically connected to the probe card 3 via a performance board (not shown). The semiconductor wafer W on the wafer chuck 1 is set with an inspection temperature ranging from low temperature to high temperature, for example, and then low temperature inspection or high temperature inspection of the semiconductor wafer W is performed by using a tester signal transmitted to the probes 3A via the test head T.

For the low temperature inspection of the semiconductor wafer W, generally as shown in FIG. 4, a refrigerant is cooled to a predetermined temperature by a cooling device 6 connected to the wafer chuck 1 and is circulated through a refrigerant passage within the wafer chuck 1, thereby cooling the semiconductor wafer W to a low temperature range of, for example, several tens of degrees C. below 0 degrees C. The present inventor has supposed a cooling/heating device capable of keeping a temperature of a refrigerant circulating through the wafer chuck 1 constant. This cooling/heating device uses a primary refrigerant of a Stirling refrigerator to cool/heat a secondary refrigerant circulating through the wafer chuck to a predetermined range of temperatures below 0 degrees C., which may result in simplification of a cooling circuit as compared to existing cooling devices.

However, since the cooling device described above is driven simultaneously with an inspection apparatus without distinction between low temperature inspection and high temperature inspection in the inspection apparatus and the secondary refrigerant cooled to a predetermined temperature for the low and high temperature inspections always flows through the cooling device even when the high temperature inspection is performed, energy is consumed due to running of the cooling device during the high temperature inspection, which is undesirable in terms of energy savings.

In addition, a cooling device used for a vacuum processing apparatus has been known. This cooling device cools a cooling object (a shower plate of a vacuum chamber) with a primary refrigerant directly rather than cooling the shower plate with a secondary refrigerant as in the above cooling device.

The cooling device used for a vacuum processing apparatus is simply provided to cool the shower plate of the vacuum chamber and has problems when used in an apparatus such as in an inspection apparatus since it is used without distinction between high temperature and low temperature.

SUMMARY

The present disclosure provides an inspection apparatus for high and low temperature inspections, and a method for operation of a cooling device used in the inspection apparatus, which is capable of reducing power consumption of the cooling device.

According to one embodiment of the present disclosure, there is provided a cooling device operating method for controlling a cooling device which cools a loading table under control of a controller for performing low temperature inspection and high temperature inspection of an object under control of the controller by loading the object on a loading table of which the temperature is controllable through the cooling device and a heating device, and the method comprises continuously running the cooling device through control of the controller for the low temperature inspection and stopping the cooling device through control of the controller at least one time at the start of the high temperature inspection.

According to another embodiment of the present disclosure, there is provided a cooling device operating method for controlling a cooling device which cools a loading table under control of a dedicated controller provided in the cooling device for performing low temperature inspection and high temperature inspection of an object under control of a controller by loading the object on a loading table of which the temperature is controllable through the cooling device and a heating device, and the method comprises continuously running the cooling device through control of the dedicated controller for the low temperature inspection and stopping the cooling device through control of the dedicated controller at least one time at the start of the high temperature inspection.

According to another embodiment of the present disclosure, there is provided an inspection apparatus including a temperature-controllable loading table on which an object is loaded, a heating device which heats the loading table, a cooling device which cools the loading table, and a controller which controls the heating device and the cooling device for performing low temperature inspection and high temperature inspection of the object, wherein the controller controls the cooling device to stop at least one time at the start of the high temperature inspection for the high temperature inspection.

According to another embodiment of the present disclosure, there is provided an inspection apparatus including a temperature-controllable loading table on which an object is loaded, a heating device which heats the loading table, a cooling device which cools the loading table, a controller which controls the heating device and the cooling device for performing low temperature inspection and high temperature inspection of the object, and a dedicated controller provided in the cooling device, wherein the dedicated controller controls the cooling device to stop at least one time at the start of the high temperature inspection for the high temperature inspection.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 2A shows a case where the cooling device is stopped for high temperature inspection and is run at the start of low temperature inspection, according to one embodiment of the present disclosure, FIG. 2B shows a case where the cooling device is stopped for high temperature inspection and intermittently alternates between running and stopping until low temperature inspection is started, according to another embodiment of the present disclosure, and FIG. 2C shows a conventional cooling device operating method.

FIG. 4 is a front view showing a conventional inspection apparatus including a loading device.

DETAILED DESCRIPTION

Embodiments of the present disclosure will now be described in detail with reference to FIGS. 1 to 3.

First Embodiment

Figure 1:
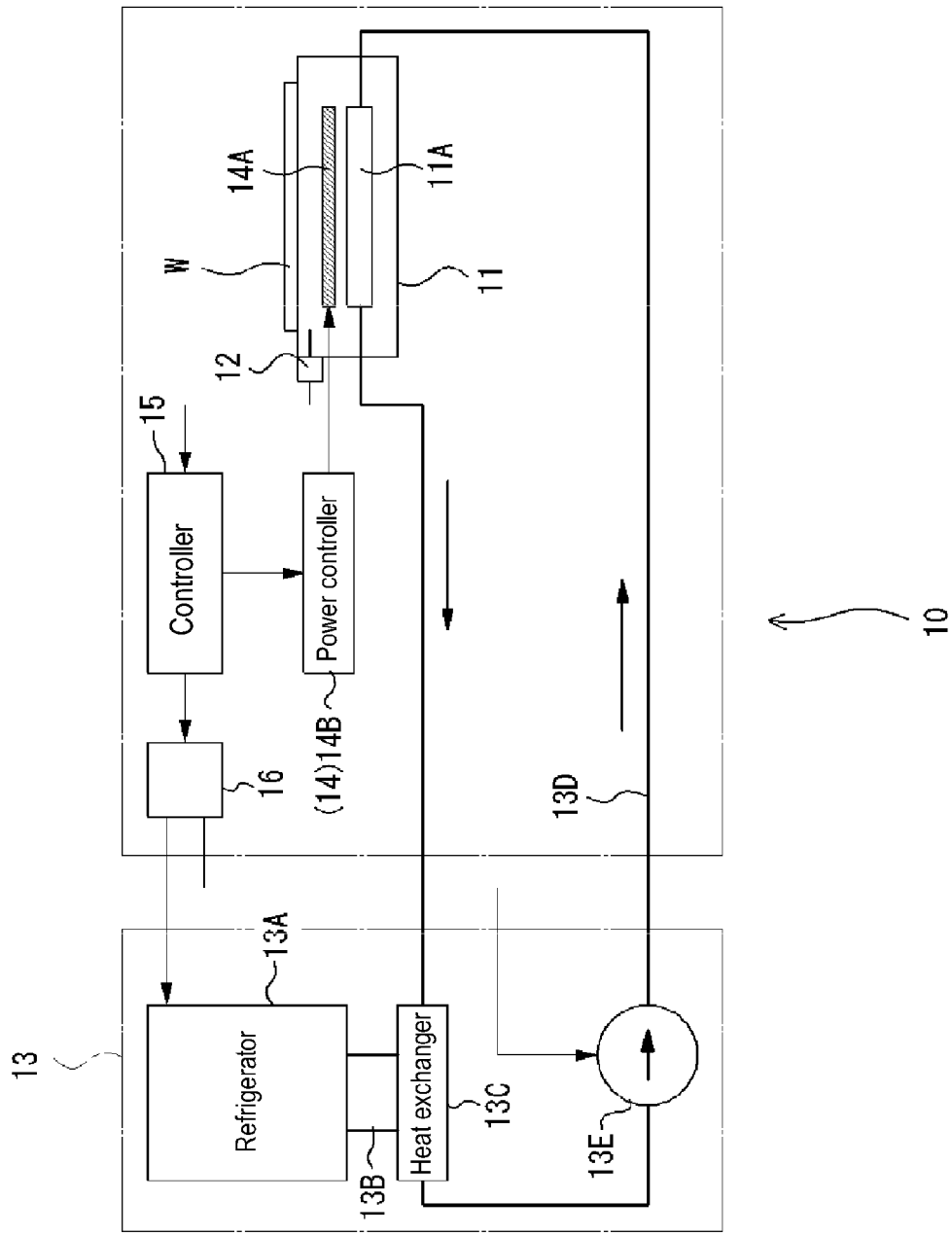
FIG. 1 is a block diagram showing an inspection apparatus according to one embodiment of the present disclosure.

Referring to FIG. 1, an inspection apparatus 10 of this embodiment includes a temperature controllable loading table (wafer chuck) 11 which loads a semiconductor wafer W, a temperature sensor 12 which detects a temperature of the wafer chuck 11, a cooling device 13 which cools the wafer chuck 11, a heating device 14 which heats the wafer chuck 11, a controller 15 which stores a low temperature inspection program and a high temperature inspection program, and a relay switch 16 which controls turning-ON/OFF of the cooling device 13 under control of the controller 15, and is configured to perform low temperature inspection and high temperature inspection for the semiconductor wafer W loaded on the wafer chuck 11 based on the low temperature inspection program and the high temperature inspection program stored in the controller 15. In the specification, inspection of the electrical characteristics of semiconductor wafer W is performed, for example, at a temperature of 50 degrees C. or higher which is defined as a high temperature inspection and inspection performed at a temperature of less than 50 degrees C. which is defined as a low temperature inspection.

In addition to the above-mentioned components, the inspection apparatus 10 further includes other components required for the inspection, such as a probe card, an alignment mechanism and so on, like the conventional inspection apparatuses mentioned earlier, and is further configured to perform the low temperature and the high temperature inspections for the semiconductor wafer W by electrically contacting a plurality of probes of the probe card with a plurality of electrode pads of the semiconductor wafer W on the wafer chuck 11.

When the electrical characteristics inspection for the semiconductor wafer W is performed, since the semiconductor wafer W is heated by electrical conduction to electrical circuits formed on the semiconductor wafer W in either the low temperature inspection or the high temperature inspection, the heat increases the temperature of the wafer chuck 11. The temperature sensor 12 detects the temperature of the wafer chuck 11 during the inspection and transmits the detected temperature, as a detection signal, to the controller 15. The controller 15 controls the cooling device 13 or the heating device 14 based on the detection signal from the temperature sensor 12 and keeps the wafer chuck 11 at a predetermined temperature required for the low temperature inspection and the high temperature inspection, respectively.

As shown in FIG. 1, the cooling device 13 includes a refrigerator 13A which cools a primary refrigerant, a heat exchanger 13C which is connected to the refrigerator 13A via a first circulating line 13B and circulates the primary refrigerant, a second circulating line 13D which connects the heat exchanger 13C with a refrigerant passage 11A formed in the wafer chuck 11 and circulates a secondary refrigerant, and a pump 13E which is placed on the second circulating line 13D, and is configured to continuously operate the refrigerator 13A to cool the secondary refrigerant to a predetermined low temperature (for example, 50 degrees C. below 0 degrees C.) for the low temperature inspection while stopping the refrigerator 13A at least one time at the start of the high temperature inspection through the relay switch 16 actuated under control of the controller 15. It is here assumed that the first and second circulating lines 13B and 13D have been already insulated.

In addition, as shown in FIG. 1, the heating device 14 includes a heater 14A placed within the wafer chuck 11, and a power controller 14B which controls power to be applied to the heater 14A, and is configured to keep the wafer chuck 11 at a predetermined high temperature by means of the heater 14A by controlling the power controller 14B based on the detection signal from the temperature sensor 12 under control of the controller 15. The heater 14A is arranged above the refrigerant passage 11A, as shown in FIG. 1.

For the low temperature inspection, the controller 15 starts operation of the refrigerator 13A and the pump 13E in the cooling device 13 by transmitting a low temperature inspection start signal to the refrigerator 13A and the pump 13E and continuously runs the cooling device 13 during the low temperature inspection to keep the secondary refrigerant at a predetermined low temperature (for example, 50 degrees C. below 0 degrees C.). That is, when the cooling device 13 is started, the primary refrigerant cooled by the refrigerator 13A circulates through a shell of the heat exchanger 13C via the first circulating line 13B. While the primary refrigerant is circulating through the heat exchanger 13C, the secondary refrigerant circulating through a tube of the heat exchange 13C via the pump 13E exchanges heat with the first refrigerant and is cooled to a predetermined temperature. The secondary refrigerant cooled to the predetermined temperature cools the wafer chuck 11 to a temperature required for the low temperature inspection while circulating through the refrigerant passage 11A of the wafer chuck 11. During the low temperature inspection, based on the detection signal from the temperature sensor 12, the controller 15 controls the pump 13E to regulate the flow rate of the secondary refrigerant, thereby allowing the wafer chuck 11 to be cooled to and kept at a temperature required for the low temperature inspection.

For the high temperature inspection, the controller 15 controls the power controller 14B of the heating device 14 by transmitting a start signal to the power controller 14B. When the heating device 14 is actuated, based on the detection signal from the temperature sensor 12, the controller 15 controls the heater 14A through the power controller 14B to heat the wafer chuck 11 to a temperature required for the high temperature inspection and to keep the temperature.

For the high temperature inspection, since the wafer chuck 11 does not need to be cooled, only the heating device 14 is actuated and the cooling device 13 is stopped at least at a start of the high temperature inspection under control of the controller 15. In this manner, power consumption can be reduced since the cooling device 13 is stopped for the high temperature inspection. During the high temperature inspection, the cooling device 13 stops at least one time at the start of the high temperature inspection through the relay switch 16 actuated under control of the controller 15 and resumes running at the next low temperature inspection. The relay switch 16 may be set to intermittently alternate between stopping and running during the high temperature inspection. In that case, the running time and stopping time may be properly set by the controller 15. In some embodiments the cooling device 13 intermittently alternates between stopping and running through the relay switch 16 at a frequency of less than several times per hour, as will be described later. Frequent alternation between stopping and running of the cooling device 13 is not preferable in some instance since it accelerates the wearing of driving components of the cooling device 13.

Subsequently, an operation method of the above-configured cooling device applied to the inspection apparatus according to an embodiment will be described with reference to FIGS. 2A to 2C.

Figure 2A:
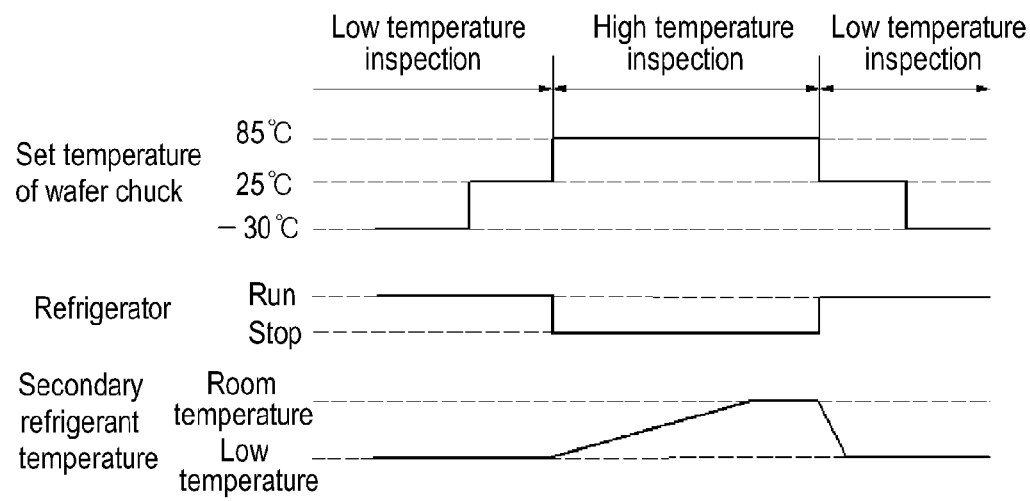
FIGS. 2A to 2C are timing charts used to explain an operating method of a cooling device in inspecting a semiconductor wafer.
Figure 3:
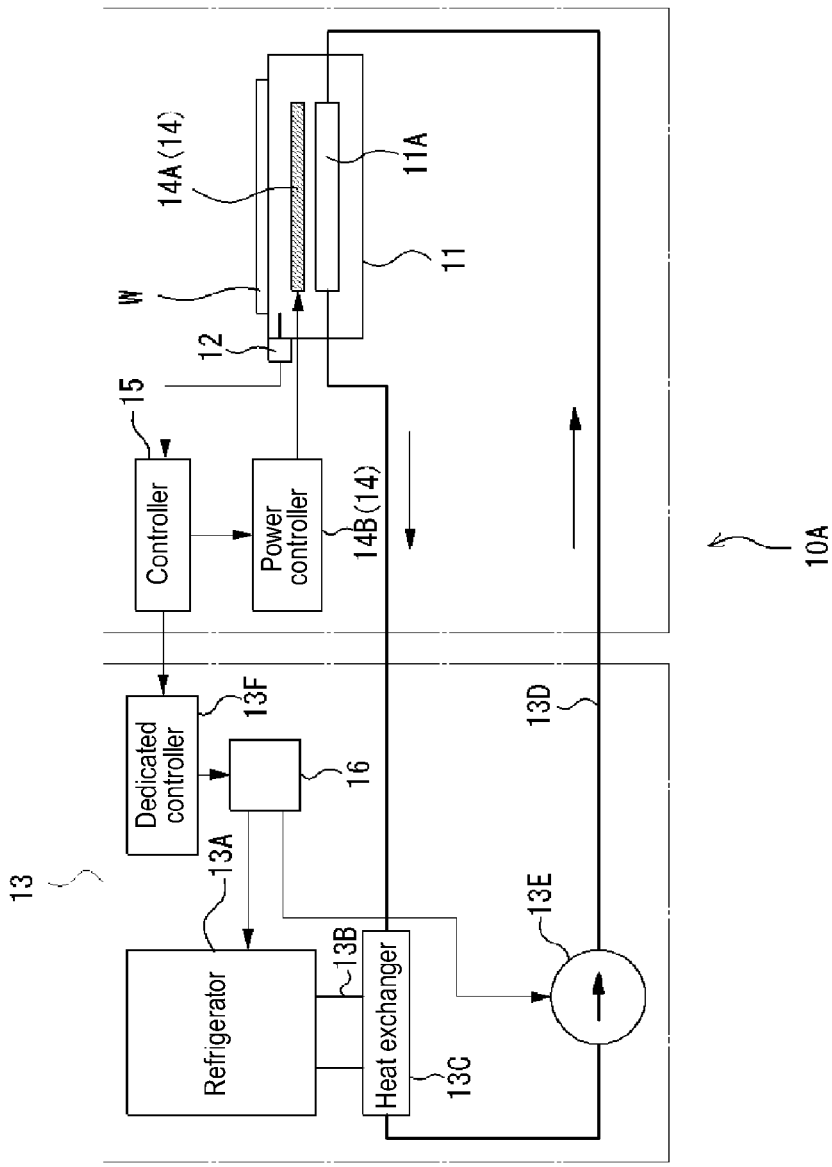
FIG. 3 is a sectional view showing an inspection apparatus according to another embodiment of the present disclosure.

FIG. 2A shows an operation method of the above-configured cooling device in which the electrical characteristics of a semiconductor wafer are inspected in an order of low temperature inspection, high temperature inspection and low temperature inspection, according to an embodiment of the present disclosure. First, for the low temperature inspection, the cooling device 13 is continuously run as shown in FIG. 2A, based on a command signal from the controller 15. At this time, while a primary refrigerant cooled in the refrigerator 13A is circulating through the heat exchanger 13C, a secondary refrigerant is cooled to a predetermined temperature (for example, 50 degrees C. below 0 degrees C.). The secondary refrigerant circulates through the refrigerant passage 11A of the wafer chuck 11 via the second circulating line 13D and cools the wafer chuck 11 to a temperature (for example, 30 degrees C. below 0 degrees C.) required for the low temperature inspection of the semiconductor wafer W, and the low temperature inspection of the semiconductor wafer W is initiated.

During the low temperature inspection, the temperature sensor 12 detects the temperature of the wafer chuck 11 and the controller 15 controls the pump 13E based on the detection signal from the temperature sensor 12 to keep the temperature of the wafer chuck 11 at 30 degrees C. below 0 degrees C. During the low temperature inspection, even when the semiconductor wafer W is heated to increase the temperature of the wafer chuck 11, the temperature of the wafer chuck 11 may be kept constant by increasing the flow rate of the circulating secondary refrigerant by means of the pump 13E based on the detection signal of the temperature sensor 12.

In the low temperature inspection, since the temperature of the wafer chuck 11 can be kept constant as described above, the low temperature inspection for the semiconductor wafer W can be stably performed. In addition, if the temperature at which the low temperature inspection of the semiconductor wafer W is performed is changed according to the command signal from the controller 15 from 30 degrees C. below 0 degrees C. to 25 degrees C., the cooling device 13 keeps the temperature of the wafer chuck 11 at 25 degrees C. by decreasing the flow rate of the secondary refrigerant by means of the pump 13E, and the low temperature inspection is performed at 25 degrees C.

After completion of the low temperature inspection, when the low temperature inspection is switched to the high temperature inspection (for example, at 85 degrees C.) based on a command signal from the controller 15, the cooling device 13 stops running at the start of the high temperature inspection through the relay switch 16 which is actuated by the command signal from the controller 15, and the heating device 14 is actuated under control of the controller 15, as shown in FIG. 2A.

When the heating device 14 is actuated, the power controller 14B applies power to the heater 14A which then heats the wafer chuck 11 to the temperature required for the high temperature inspection, 85 degrees C. The power controller 14B is controlled by the controller 15 which receives the detection signal from the temperature sensor 12 to keep the temperature of the wafer chuck 11 at 85 degrees C. and to perform the high temperature inspection of the semiconductor wafer W. The cooling device 13 pauses until the next low temperature inspection starts.

As described above, in the operation method shown in FIG. 2A, since the cooling device 13 stops running through the relay switch 16 during the high temperature inspection, power consumption required to run the cooling device 13 can be reduced. In addition, the wearing of driving components of the cooling device 13 which is used to stop the running of the cooling device 13 can be minimized.

In the embodiment shown in FIG. 2A, since the cooling device 13 pauses during the high temperature inspection, the temperature of the refrigerator 13A, the heat exchanger 13C, and the secondary refrigerant in the heat exchanger 13C slowly increase due to the heat introduced from outside. Accordingly, when the cooling device 13 resumes its operation for the next low temperature inspection, latency time occurs before starting the low temperature inspection since it takes time for the secondary refrigerant to be cooled to the original temperature (50 degrees C. below 0 degrees C.). If the latency time does not matter, the operation method of the cooling device according to this embodiment can be employed.

However, there may be a case where the latency time has to be reduced as much as possible depending on inspection situations. In this case, a cooling device operation method shown in FIG. 2B may be replaced for the cooling device operation method shown in FIG. 2A.

Figure 2B:
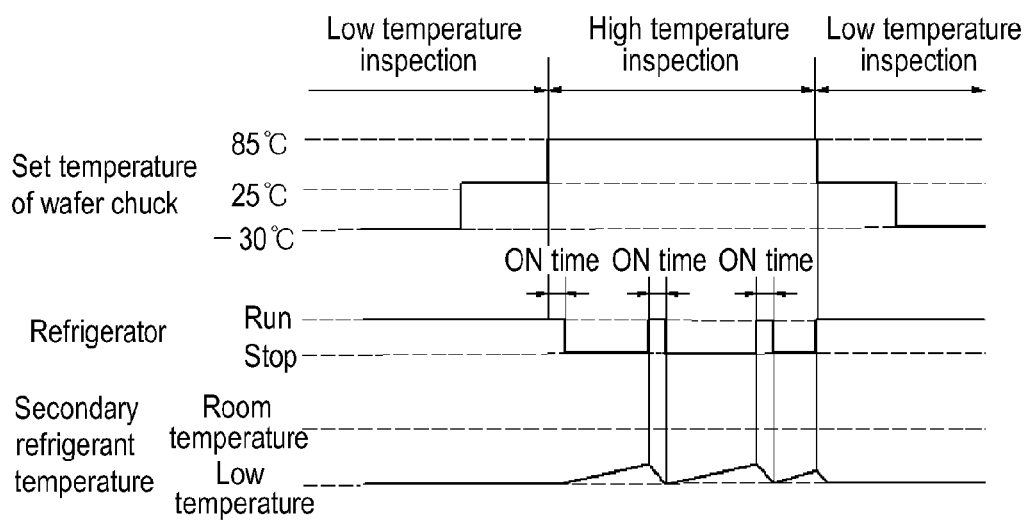
Figure 2C:
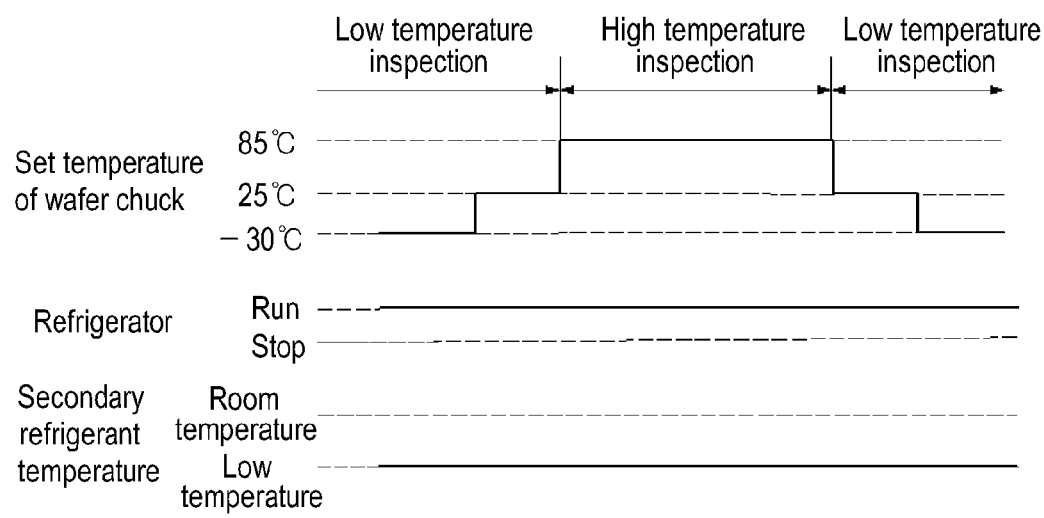

An embodiment shown in FIG. 2B is similar to the embodiment shown in FIG. 2A except for an operation method of the cooling device 13 for high temperature inspection, and therefore only the operation method of the cooling device for the high temperature inspection will be described below.

In the embodiment of FIG. 2B, when the low temperature inspection is changed to the high temperature inspection, the cooling device 13 stops at the start of the high temperature inspection under control of the controller 15. During the high temperature inspection, the cooling device 13 intermittently alternates between stopping and running through the relay switch 16 controlled by the controller 15. At this time, in some embodiments it is preferable that ON/OFF timing of the relay switch 16 is set such that the cooling device 13 intermittently alternates between stopping and running at a frequency of less than several times per hour.

As the cooling device 13 intermittently alternates between stopping and running, even when the temperature of the secondary refrigerant in the heat exchanger 13C increases during the stop of the cooling device 13, the cooling device 13 resumes to cool the temperature-increased secondary refrigerant to return the temperature of the secondary refrigerant to the original temperature in a short time and then the cooling device 13 stops again. This operation is repeated until the high temperature inspection is ended through the relay switch 16 in order to prevent the temperature of the secondary refrigerant from increasing as much as possible. Accordingly, even when the high temperature inspection is changed to the low temperature inspection, since the increase in the temperature of the secondary refrigerant at the time of changing is low, the secondary refrigerant can be returned to the original temperature (for example, 50 degrees C. below 0 degrees C.) in a short time, thereby reducing the latency time for the start of the low temperature inspection and allowing fast change from the high temperature inspection to the low temperature inspection This stands out in comparison with the operation method shown in FIG. 2C in which a cooling device continuously runs from the beginning to the end of inspecting an apparatus where the temperature of the secondary refrigerant is kept at a temperature required for the low temperature inspection. In this embodiment, it is preferable to have the increase in temperature from the predetermined temperature of the secondary refrigerant to be about, for example, 10 degrees C., during the stop of the intermittent running of the cooling device 13.

As described above, according to this embodiment, it is possible to reduce power consumption of the cooling device 13 and achieve fast change from the high temperature inspection to the low temperature inspection to increase the inspection efficiency.

Second Embodiment

In the inspection apparatus of the first embodiment, the controller 15 provided in the inspection apparatus 10 is used to control the cooling device 13. In an inspection apparatus 10A of a second embodiment, a cooling device 13 includes a dedicated controller 13F which basically replaces the controller 15 regarding the running of the cooling device 13, as shown in FIG. 3.

That is, the controller 15 is connected to the dedicated controller 13F and transmits a set temperature of the wafer chuck 11 to the dedicated controller 13F. The cooling device 13 runs the low temperature or high temperature inspection according to the dedicated controller 13F actuated based on the temperature of the wafer chuck 11 set by the controller 15. For the low temperature inspection, a refrigerator 13A runs through the dedicated controller 13F and a relay switch 16 and keeps the temperature of a secondary refrigerant at a predetermined low temperature, and the controller 15 controls the flow rate of the secondary refrigerant circulated by a pump 13E based on a detection signal from a temperature sensor 12 so that a temperature of the wafer chuck 11 is kept at a temperature required for the low temperature inspection. For the high temperature inspection, the cooling device 13 runs through the dedicated controller 13F and the relay switch 16. For the high temperature inspection, the cooling device 13 runs as shown in FIG. 2A or FIG. 2B under control of the dedicated controller 13F. This embodiment is expected to provide the same operation and effects as the first embodiment.

According to the present disclosure, it is possible to provide an inspection apparatus and a method for operation of a cooling device used in the inspection apparatus, which is capable of reducing power consumption of the cooling device.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A cooling device operating method for controlling a cooling device including a refrigerator, a heat exchanger connected to the refrigerator via a first circulating line circulating a first refrigerant and to a loading table via a second circulating line circulating a second refrigerant, and a pump placed on the second circulating line, to cool the loading table under control of a controller for performing low temperature inspection and high temperature inspection of an object under control of the controller by loading the object on the loading table of which the temperature is controllable through the cooling device and a heating device, the method comprising:

continuously running the refrigerator to circulate the first refrigerant to the heat exchanger via the first circulating line and circulating the second refrigerant cooled in the heat exchanger to the loading table via the second circulating line by the pump through control of the controller for the low temperature inspection;

stopping the refrigerator and the pump not to circulate the first and second refrigerants through control of the controller at least one time at the start of the high temperature inspection; and alternating the running and stopping of the refrigerator intermittently to circulate the first refrigerant to the heat exchanger via the first circulating line while stopping the pump not to circulate the second refrigerant through control of the controller until the high temperature inspection ends.

2. The cooling device operating method of claim 1, wherein the high temperature inspection is performed after performing the low temperature inspection.

3. The cooling device operating method of claim 2, wherein, after the high temperature inspection is completed, the low temperature inspection is performed.

4. An inspection apparatus comprising:

a temperature-controllable loading table on which an object is loaded;

a heating device for heating the loading table;

a cooling device including a refrigerator, a heat exchanger connected to the refrigerator via a first circulating line circulating a first refrigerant and to a loading table via a second circulating line circulating a second refrigerant, and a pump in the second circulating line; and a controller for controlling the heating device and the cooling device for low temperature inspection and high temperature inspection of the object, wherein the controller is configured to control the cooling device to continuously run the refrigerator to circulate the first refrigerant to the heat exchanger via the first circulating line and circulating the second refrigerant cooled in the heat exchanger to the loading table via the second circulating line by the pump for the low temperature inspection, to stop the refrigerator and the pump not to circulate the first and second refrigerants at least one time at the start of the high temperature inspection for the high temperature inspection and to intermittently alternate between running and stopping of the refrigerator to circulate the first refrigerant to the heat exchanger via the first circulating line while stopping the pump not to circulate the second refrigerant until the high temperature inspection is ended.

* * * * *